United States Patent
Sakai

[11] Patent Number: 6,151,775
[45] Date of Patent: *Nov. 28, 2000

[54] MULTILAYER CIRCUIT BOARD AND METHOD OF PRODUCING THE SAME

[75] Inventor: Norio Sakai, Moriyama, Japan

[73] Assignee: Murata Manufacturing Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 09/002,660

[22] Filed: Jan. 5, 1998

[30] Foreign Application Priority Data

Jan. 6, 1997 [JP] Japan .................................. 9-000329

[51] Int. Cl.$^7$ ...................................................... H05K 3/36
[52] U.S. Cl. ................................ 29/830; 29/593; 29/412; 29/413; 29/414; 29/852; 174/255; 174/261
[58] Field of Search ..................................... 174/255, 261; 361/767; 29/593, 849, 852, 854, 830, 412, 413, 414

[56] References Cited

U.S. PATENT DOCUMENTS 5,488,765  2/1996  Kubota et al. .

FOREIGN PATENT DOCUMENTS 5-63140   3/1993  Japan .
8-241827  9/1996  Japan .

Primary Examiner—Carl J. Arbes
Attorney, Agent, or Firm—Ostrolenk, Faber, Gerb & Soffen, LLP

[57] ABSTRACT

A multilayer circuit board 10 has a laminate 11 formed by stacking together a plurality of insulating sheets with intervening inner circuit elements (not shown). In a first main surface of the laminate 11, there is formed a cavity 12 in which electronic parts such as integrated circuits (not shown) are mounted. Further, for example, in each of the four side surfaces of the laminate 11, there is formed a step portion 13 that is at the boundary between upper and lower halves 111 and 112 of the laminate 11. That is, due to the presence of the step portions 13, the lower half 112 having a height h2 protrudes from the upper half 111 having a height h1. Further, external electrodes (not shown) are formed on the second main surface of the laminate 11 by screen printing. By this structure, there is provided a small-sized multilayer circuit board in which the cavity side walls are not chipped off when the multilayer circuit board is separated from the mother laminate.

3 Claims, 4 Drawing Sheets

MULTILAYER CIRCUIT BOARD AND METHOD OF PRODUCING THE SAME

BACKGROUND OF THE INVENTION

1. Field of the Invention

The present invention relates to a multilayer circuit board in which inner circuit elements are arranged. More particularly, the present invention relates to a multilayer circuit board comprising a laminate having a plurality of insulating sheets laminated to each other and one or more inner circuit element disposed on one or more of a plurality of said insulating sheets, said laminate having first and second main surfaces opposed to each other, side surfaces connecting said main surfaces and a cavity formed in said first main surface.

2. Description of the Related Art

FIG. 8 shows a conventional multilayer circuit board. A multilayer circuit board 50 comprises a laminate 51 consisting of a plurality of insulating sheets stacked together with intervening inner circuit elements (not shown). A cavity 52 is provided in the surface of the laminate 51. In the side surfaces of the multilayer circuit board 50, there are provided recesses, to which conductive members are attached to form external electrodes 53, which are connected by reflow soldering or the like to electrodes on a mounting board (not shown) when the multilayer circuit board is mounted on the mounting board.

In the above-described conventional multilayer circuit board, it is necessary, for the sake of a reduction in size, to reduce the thickness w' of the side walls of the cavity (FIG. 8) to, for example, 1.0 mm or less. However, a reduction in the thickness of the side walls of the cavity results in the side walls of the cavity being chipped off when the multilayer circuit board is separated from the mother laminate.

SUMMARY OF THE INVENTION

The present invention has been made with a view toward solving the above problem in the prior art. The present invention provides a small-sized multilayer circuit board whose cavity side walls are oriented so that they will not be chipped off when it is separated from the mother laminate.

The invention provides a multilayer circuit board, comprising a laminate having a plurality of insulating sheets laminated to each other and at least one inner circuit element disposed on one or more of a plurality of said insulating sheets, said laminate having first and second main surfaces opposed to each other, side surfaces connecting said main surfaces and a cavity formed in said first main surface, wherein a step portion is provided on at least one of said side surfaces of said laminate. The step portion causes the corresponding cavity side wall to be spaced away from other portions of said at least one side surface.

In the multilayer circuit board of the present invention, step portions may be formed on one or more of the side surfaces of the laminate, so that the cavity side walls are not chipped off when the multilayer circuit board is separated from the mother laminate. Thus, it is possible to reduce the width of the cavity sidewalls, thereby achieving a reduction in the size of the multilayer circuit board.

Further, due to the presence of the step portions, the second-main-surface-side portion of the laminate is larger than the first-main-surface-side portion thereof, so that the attitude of the individual multilayer circuit boards is stabilized during measurement, taping, transportation, and mounting. Thus, it is possible to prevent the multilayer circuit board from being damaged.

The above multilayer circuit board may further comprise an external electrode formed on the outer surface of said laminate and electrically connected to said inner circuit element.

Another aspect of the invention provides a method of producing a multilayer circuit board comprising the steps of: 1) preparing a mother laminate formed by stacking together a plurality of mother insulating sheets with a plurality of said inner circuit elements, each of said inner circuit elements being formed on one or more of said mother insulating sheets and disposed at a predetermined location within said mother laminate corresponding to a respective one of the multilayer circuit boards to be formed from said mother laminate; 2) making a plurality of cavities on one main surface of said mother laminate, each of said cavities being disposed at a predetermined location on said mother laminate corresponding to a respective multilayer circuit board to be formed, 3) forming grooves extending from said main surface of said mother laminate at predetermined locations corresponding to the multilayer circuit boards to be formed, and 4) dividing said mother laminate at the positions of said grooves to form a plurality of multilayer circuit boards.

In the above-described method, grooves are formed extended from the main surface of the mother laminate, and then the mother laminate is divided at the positions of the grooves, so that the cavity side walls are not chipped off. Thus, it is possible to reduce the width of the cavity side walls, thereby achieving a reduction in the size of the multilayer circuit board.

In the above method, a slit may be provided at the bottom of said groove. The slit further facilitates the dividing of the mother laminate.

Other features and advantages of the present invention will become apparent from the following description of the invention which refers to the accompanying drawings.

DETAILED DESCRIPTION OF EMBODIMENTS OF THE INVENTION

Figure 1:
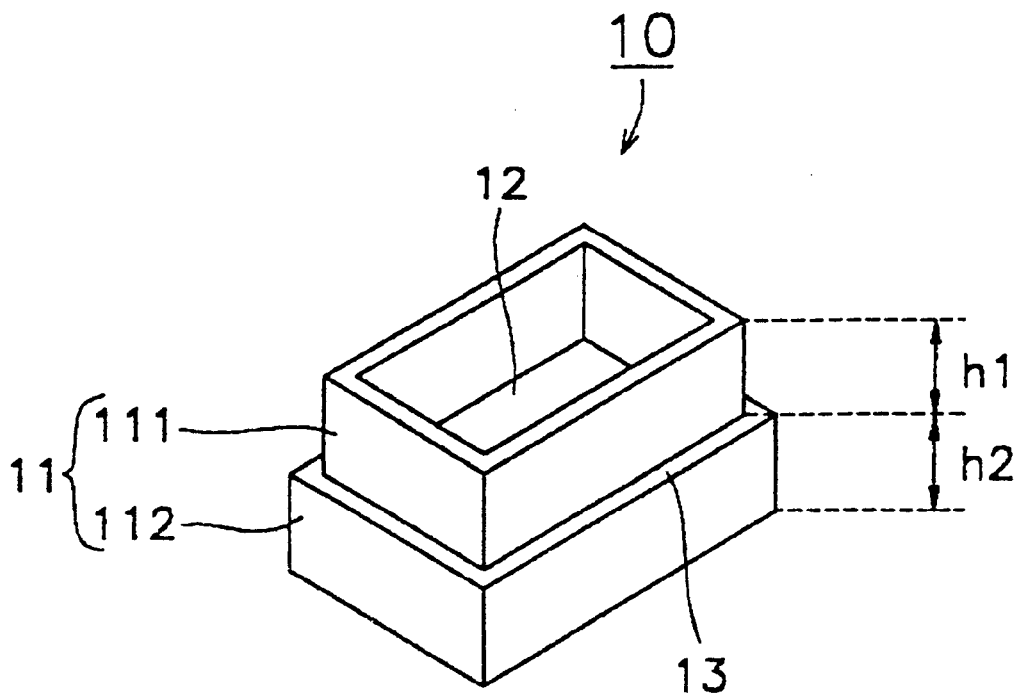
FIG. 1 is a perspective view of a multilayer circuit board in accordance with an embodiment of the present invention as seen from the direction of a first main surface thereof.
Figure 2:
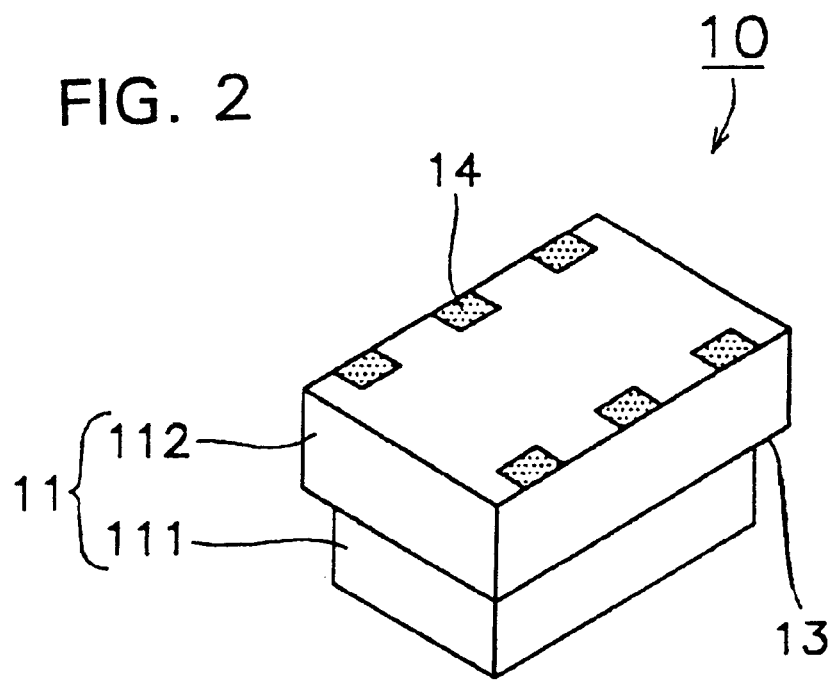
FIG. 2 is a perspective view of the multilayer circuit board shown in FIG. 1 as seen from the direction of the second main surface thereof.

FIGS. 1 and 2 are perspective views of a multilayer circuit board in accordance with an embodiment of the present invention. FIG. 1 is a perspective view of the multilayer circuit board as seen from the direction of the first main surface thereof, that is, the main surface having a cavity; and FIG. 2 is a perspective view of the multilayer circuit board as seen from the direction of the second main surface thereof, that is, the surface constituting the circuit board side when mounted.

A multilayer circuit board 10 comprises a laminate 11 having a plurality of insulating sheets stacked together with intervening inner circuit elements (not shown). In the first main surface of the laminate 11, there is formed a cavity 12, in which electronic parts such as integrated circuits (not shown) can be mounted. Further, on each of the four sides of the laminate, there is formed a step portion 13, which constitutes a boundary between a first-main-surface side of the laminate, that is, an upper half 111, and the second-main-surface side of the laminate, that is, a lower half 112. That is, due to the presence of the step portions 13, the laminate is divided into the lower half 112 having a height h2 and the upper half 111 having a height h1. Further, external terminals 14 are formed on the second main surface of the laminate by screen printing.

Figure 3:
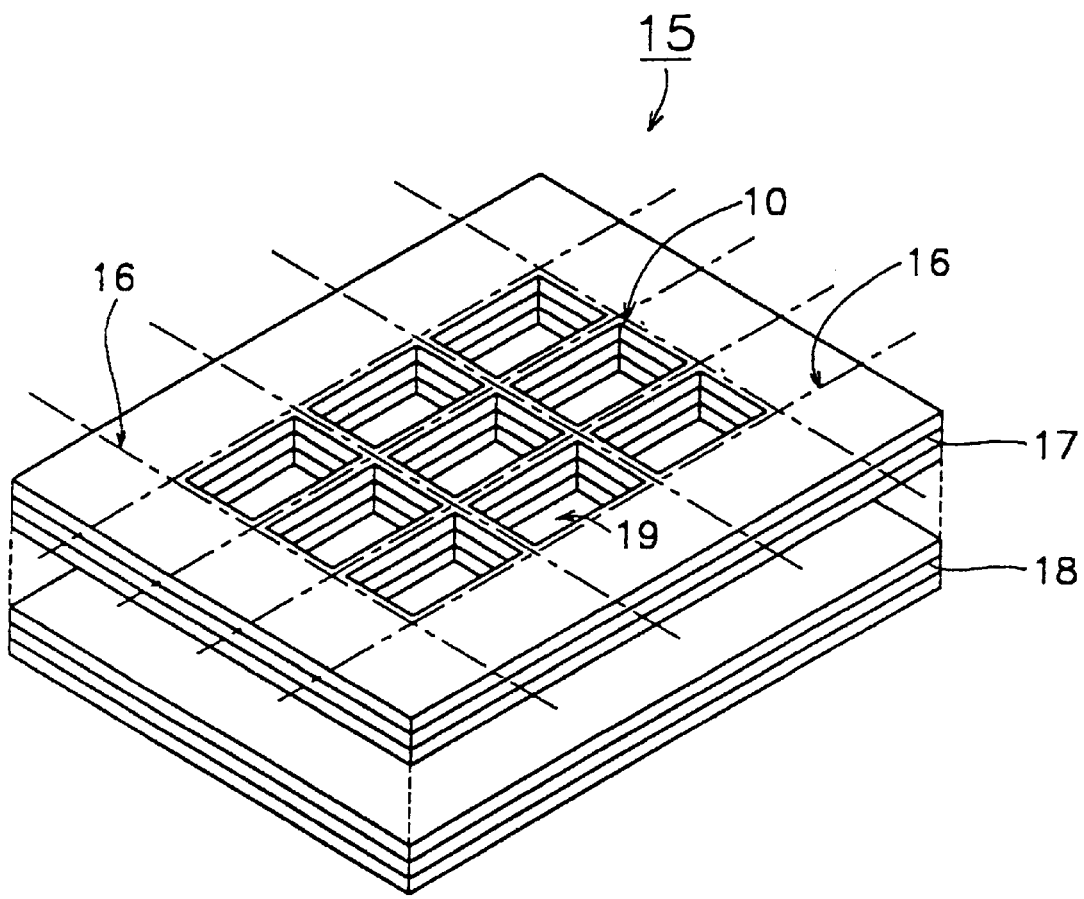
FIG. 3 is a partially cutaway perspective view showing a mother laminate prepared for the purpose of obtaining the multilayer circuit board shown in FIG. 1.

To obtain the multilayer circuit board 10, constructed as described above, a mother laminate 15 as shown in FIG. 3 is prepared. The mother laminate 15 is cut along predetermined cutting lines (one-dot chain lines) 16 to thereby provide a plurality of multilayer circuit boards 10. The mother laminate 15 is formed by stacking together a plurality of insulating sheets 17 and 18 so that the inner circuit elements (not shown) for the individual multilayer circuit boards 10 are distributed respectively in each of the regions defined by the cutting lines 16. Further, in the first main surface of the mother laminate 15, there are formed openings 19 which are to constitute cavities 12 (FIG. 1). On the second main surface of the mother laminate 15, there are formed external electrodes 14 (FIG. 2) electrically connected to the inner circuit elements (not shown).

To obtain the mother laminate 15, constructed as described above, the following process, for example, is executed. In this embodiment, the mother insulating sheets 17 and 18 consist of ceramic sheets.

First, sheet molding is performed by the doctor blade method or the like to obtain ceramic green sheets to be used as the mother insulating sheets 17 and 18. In some of these ceramic green sheets, via holes are formed by punching or the like to realize electrical conductivity in the thickness direction of the sheet. Further, in the ceramic green sheets which are to constitute the mother insulating sheets 17, openings 19 which are to constitute the cavities 12 (FIG. 1) are formed.

Next, conductive layers, resistive layers, etc. which are to constitute the inner circuit elements are printed on the ceramic green sheets. In this process, a conductive material is formed into layers in the inner peripheral surfaces of the via holes already formed. Next, the mother insulating sheets 17 and 18 are stacked together, and pressed, and the external electrodes 14 (FIG. 2) are formed on the second main surface, whereby the mother laminate 15 is obtained.

Figure 4:
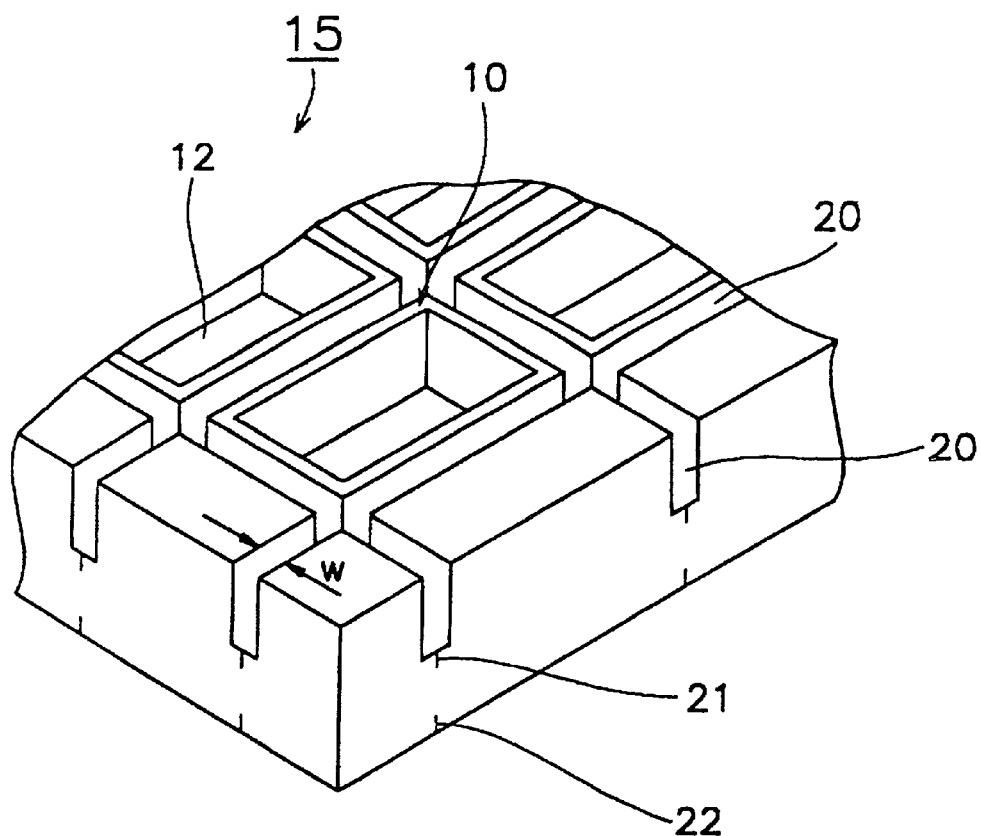
FIG. 4 is an enlarged perspective view showing how grooves are formed in the mother laminate shown in FIG. 2.

Next, as shown in FIG. 4, grooves 20 are formed in the mother laminate 15 along the cutting lines 16 (FIG. 3) by, for example, a dicing saw. In this process, slits 21 and 22 are preferably provided in the bottom surfaces of the grooves 20 and in the second main surface of the mother laminate 15 at positions opposed thereto. It is possible for either the slits 21 or 22 to be omitted.

Next, the mother laminate 15 is fired to sinter the ceramic green sheets constituting the mother insulating sheets 17 and 18. After this, conductive layers, resistive layers, etc. are formed as needed on the surface of the mother laminate 15 and the bottom surfaces of the cavities 12. Further, overcoating is effected and solder resist is imparted to the mother laminate. Further, the external electrodes 14 and the other conductive layers are plated as needed.

Next, to obtain a plurality of mechanically independent multilayer circuit boards 10, the mother laminate 15 is completely cut along the cutting lines 16 (FIG. 3), that is, the grooves 20 (FIG. 4). This cutting can be easily effected by splitting the mother laminate 15 along the grooves 20 like a bar of chocolate. In this process, the above-mentioned slits 21 and 22 further facilitate the cutting.

In this way, the multilayer circuit board 10 having the step portions 13 as shown in FIGS. 1 and 2 is obtained. As can be seen from the above description, the step portions 13 are formed as a result of the formation of the grooves 20. In the laminate 11, which is divided into the upper half 111, which is on the first-main-surface side, and the lower half 112, which is on the second-main-surface side, the cavity 12 exists only in the upper half 111.

Next, a casing (not shown) is formed on the multilayer circuit board 10. This casing serves to cover the other parts mounted in the cavity 12 of the multilayer circuit board 10.

While the present invention has been described with reference to the embodiment shown in FIGS. 1 through 4, various modifications are possible without departing from the scope of the present invention.

Figure 5:
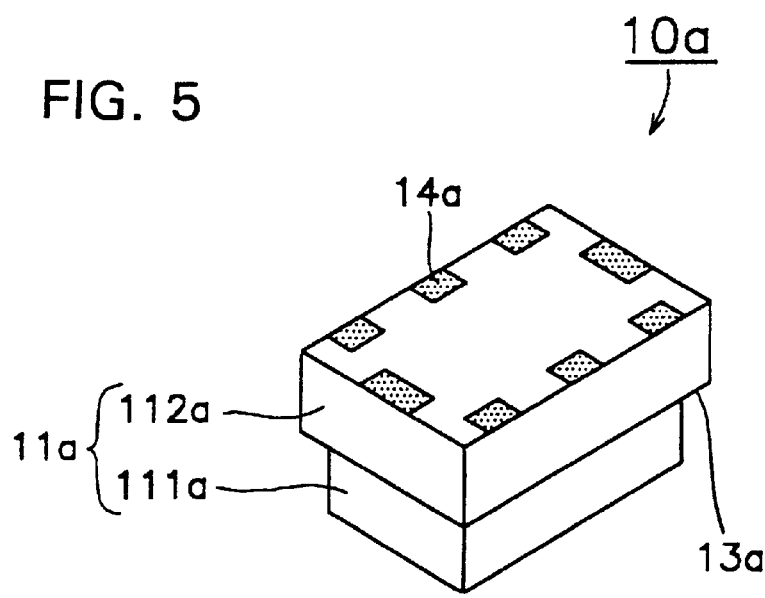
FIG. 5 is a perspective view showing a modification of the multilayer circuit board shown in FIG. 1.

For example, while in the multilayer circuit board 10 shown in FIG. 1, the external electrodes 14 are only formed on the long sides of the second main surface, that is, the lower surface, of the laminate 11, it is also possible, as in the case of the multilayer circuit board 10a shown in FIG. 5, to form external electrodes 14a in the vicinity of the short sides of the lower surface of the laminate 11a, that is, electrodes are formed in the vicinity all four of the sides of the second main surface.

Figure 6:
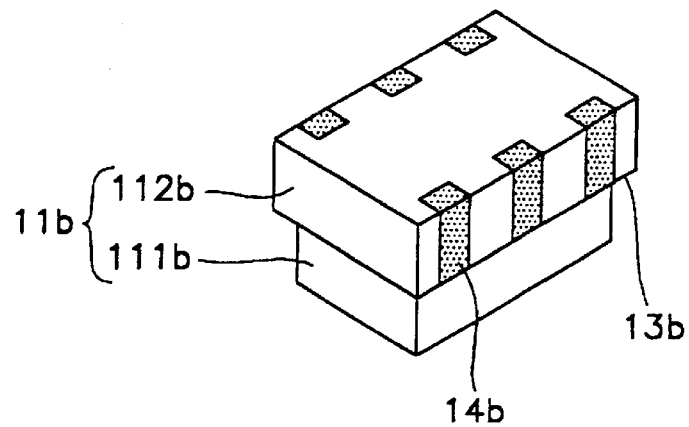
FIG. 6 is a perspective view showing another modification of the multilayer circuit board shown in FIG. 1.

Further, as in the case of a multilayer circuit board lob shown in FIG. 6, it is also possible for external electrodes 14b to be continuously formed so as to extend from the lower surface of the laminate 11b onto the side surfaces thereof. To obtain this multilayer circuit board 10b, individual laminates 11b are first obtained, and then the electrodes are formed on the portions of the side surfaces corresponding to the external electrodes 14b on the lower side by screen printing or the like.

Figure 7:
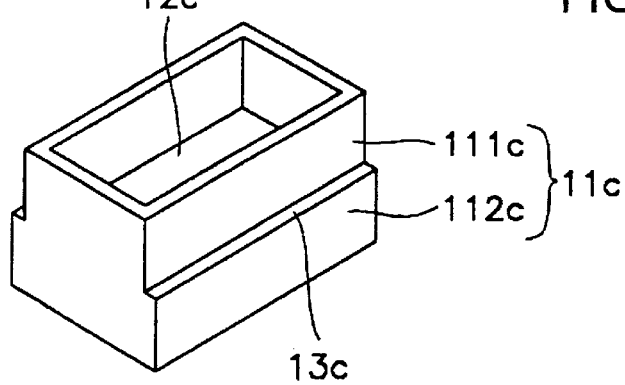
FIG. 7 is a perspective view showing still another modification of the multilayer circuit board shown in FIG. 1.
Figure 8:
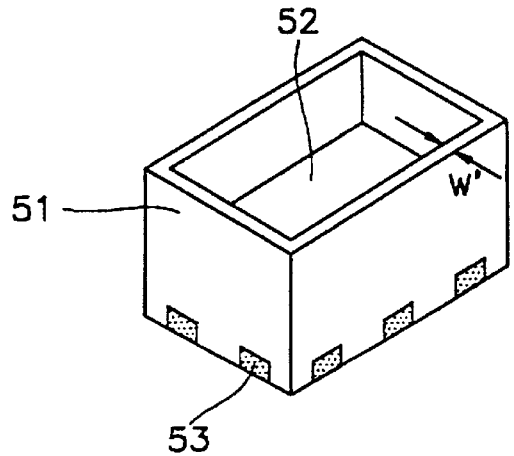
FIG. 8 is a diagram showing a conventional multilayer circuit board.

Further, while in the multilayer circuit board 10 of FIG. 1 the step portions 13 are formed on both of the two pairs of opposed sides, that is, on all four of the side surfaces, it is also possible to form step portions 13c only on two opposed side surfaces as in the case of a multilayer circuit board 10c shown in FIG. 7. To obtain this multilayer circuit board 10c, the grooves 20 (FIG. 4) are provided only on the sides where the step portions are to be provided. In the portions constituting the other sides, only the slits are formed, cutting being effected by a stroke along the cutting lines.

As described above, in the above embodiments, the multilayer circuit board has step portions formed in the boundary between the upper and lower halves of the side surfaces of the laminate, so that the side walls of the cavity are not chipped off when the multilayer circuit board is separated from the mother laminate. Thus, it is possible to reduce the width of the cavity side wall, thereby achieving a reduction in the size of the multilayer circuit board.

Further, since the lower half of the laminate is larger than the upper half thereof, the attitude of the individual multilayer circuit boards is stabilized during measurement, taping, transportation, and mounting. Thus, it is possible to prevent the multilayer circuit board from suffering damage, etc.

Further, since grooves are formed in one main surface of the mother laminate, and then the mother laminate is divided at the positions of the grooves, the cavity side walls are not chipped off. Thus, it is possible to reduce the width of the cavity side walls, thereby making it possible to reduce the size of the multilayer circuit board.

The formation of the grooves and slits may be effected after the firing of the mother laminate. Further, if the formation of the conductive layers and the resistive layers of the laminate after the firing or the efficiency in plating is not taken into account, it is possible to effect the cutting along the cutting lines prior to the firing, performing the firing of the multilayer circuit board in a mechanically separated state.

Further, the mother insulating sheet is not restricted to a ceramic green sheet. It may be replaced by a sheet formed of some other material.

Although the present invention has been described in relation to particular embodiments thereof, many other variations and modifications and other uses will become apparent to those skilled in the art. Therefore, the present invention is not limited by the specific disclosure herein.

What is claimed is:

1. A method of producing a plurality of multilayer circuit boards, comprising the steps of:
   a) preparing a mother laminate having first and second opposing main surfaces, said mother laminate being formed by stacking together a plurality of mother insulating sheets with one or more of a plurality of inner circuit elements being disposed on one or more of said mother insulating sheets at predetermined locations corresponding to respective ones of the multilayer circuit boards;
   b) making a plurality of cavities in the first main surface of said mother laminate, each of said cavities being disposed at a location corresponding to a respective one of the multilayer circuit boards;
   c) forming grooves from said first main surface toward said second main surface of said mother laminate to at least partially circumscribe respective ones of the multilayer circuit boards;
   d) forming a plurality of external terminals on said second main surface of said laminate, at least one of said terminals being disposed at a location corresponding to a respective one of the multilayer circuit boards; and
   e) dividing said mother laminate at said grooves to form the multilayer circuit boards, wherein:
      said multilayer circuit board includes first and second main surfaces opposed to each other, side surfaces connecting said main surfaces and a cavity formed in said first main surface;
      said grooves are formed at positions of said mother laminate other than positions where said external terminals are formed; and
      at least a portion of each groove forms a step portion along at least one of said side surfaces of said laminate which divides said side surface to define: (i) a first portion adjacent to said first main surface being free of any external terminals, and (ii) a second portion adjacent to said second main surface, said first and second portions of said side surface being spaced away from one another by said step portion such that said step portion is directed toward said first main surface.

2. (Amended) A method according to claim 1, further comprising the step of providing slits at the bottom of said grooves prior to dividing said mother laminate.

3. A method according to claim 1, farther comprising the step of providing slits at said second main surface opposite said slits at said grooves prior to dividing said mother laminate.

* * * * *